(12) United States Patent
Raghavan

(10) Patent No.: US 12,341,541 B2
(45) Date of Patent: Jun. 24, 2025

(54) CIRCUITS FOR CARRIER AGGREGATION OPERATION BETWEEN MODULE-INTEGRATED AND EXTERNAL FILTER PATHS

(71) Applicant: SKYWORKS SOLUTIONS, INC., Irvine, CA (US)

(72) Inventor: Anand Raghavan, Middleton, WI (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 465 days.

(21) Appl. No.: 17/944,679

(22) Filed: Sep. 14, 2022

(65) Prior Publication Data

US 2023/0088469 A1 Mar. 23, 2023

Related U.S. Application Data

(60) Provisional application No. 63/245,291, filed on Sep. 17, 2021.

(51) Int. Cl.
*H04B 1/00* (2006.01)
*H03H 7/38* (2006.01)
*H03H 9/64* (2006.01)

(52) U.S. Cl.
CPC ............. *H04B 1/0057* (2013.01); *H03H 7/38* (2013.01); *H03H 9/64* (2013.01)

(58) Field of Classification Search
CPC ................................. H04B 1/0057; H03H 7/38
See application file for complete search history.

(56) References Cited

U.S. PATENT DOCUMENTS

| | | | |
|---|---|---|---|
| 6,606,016 B2* | 8/2003 | Takamine | H03H 9/0028 333/195 |
| 9,548,522 B2 | 1/2017 | Whitefield et al. | |
| 9,553,619 B2 | 1/2017 | Domino | |
| 9,979,068 B2 | 5/2018 | Whitefield et al. | |
| 10,050,653 B2 | 8/2018 | Pehlivanoglu | |
| 10,056,925 B2 | 8/2018 | Domino | |
| 10,218,390 B2* | 2/2019 | Wloczysiak | H04B 1/0057 |
| 10,784,903 B2 | 9/2020 | Wloczysiak et al. | |
| 10,794,903 B2 | 10/2020 | Evers et al. | |
| 10,826,546 B2 | 11/2020 | Pehlivanoglu | |
| 2019/0013790 A1* | 1/2019 | Ayranci | H04B 1/006 |
| 2019/0140677 A1 | 5/2019 | Pehlivanoglu | |
| 2021/0175916 A1 | 6/2021 | Pehlivanoglu | |
| 2023/0223963 A1* | 7/2023 | Ikeuchi | H03H 9/72 455/552.1 |

* cited by examiner

*Primary Examiner* — David Bilodeau
(74) *Attorney, Agent, or Firm* — Lando & Anastasi, LLP

(57) ABSTRACT

Examples of the disclosure relate to a carrier aggregation circuit including a first path, a second path, and a switch assembly. The first path has a first filter configured to provide a matched impedance in a first frequency band. The second path has an adjustable matching network and a terminal for coupling to an external filter configured to provide a matched impedance in the second frequency band. The switch assembly is configured to adjust the adjustable matching network to provide a mismatched impedance in the first frequency band. Related methods for carrier aggregation, radio-frequency modules, and wireless devices are also provided.

25 Claims, 9 Drawing Sheets

CIRCUITS FOR CARRIER AGGREGATION OPERATION BETWEEN MODULE-INTEGRATED AND EXTERNAL FILTER PATHS

CROSS-REFERENCE TO RELATED APPLICATIONS

This application claims priority under 35 U.S.C. § 119 (e) to U.S. Provisional Patent Application Ser. No. 63/245,291, titled "CIRCUITS FOR CARRIER AGGREGATION OPERATION BETWEEN MODULE-INTEGRATED AND EXTERNAL FILTER PATHS," filed Sep. 17, 2021, the entire contents of which is incorporated herein by reference for all purposes.

BACKGROUND

Field

Examples of the disclosure relate to carrier aggregation in radio-frequency applications.

Description of the Related Technology

In some radio-frequency (RF) applications, cellular carrier aggregation (CA) can involve two or more RF signals being processed through a common path. For example, carrier aggregation can involve use of a path for a plurality of bands having frequency ranges that are sufficiently separated. In such a configuration, simultaneous operation of more than one band can be achieved.

SUMMARY

According to one example there is provided a carrier aggregation circuit comprising: a first node and a second node, a first path implemented between the first node and the second node, the first path including a first filter configured to provide a matched impedance in a first frequency band, a second path implemented between the first node and the second node, the second path including an adjustable matching network and a terminal for coupling to a filter external to the carrier aggregation circuit, the external filter configured to provide a matched impedance in the second frequency band, and a switch assembly configured to adjust the adjustable matching network to provide a mismatched impedance in the first frequency band.

In one example, the switch assembly is further configured to adjust the adjustable matching network to provide a matched impedance in the second frequency band.

In another example, the adjustable matching network comprises a first adjustable circuit including a first capacitor and a second terminal for coupling with a first inductor.

In another example, the adjustable matching network includes a second adjustable circuit including a variable capacitor and a third terminal for coupling with a second inductor.

In another example, the switch assembly includes a plurality of switches configured to adjust the second adjustable circuit to provide a substantially open-circuit impedance at the external filter for the first frequency band.

In another example, the switch assembly is configured to adjust the second adjustable circuit by selecting the capacitance of the variable capacitor to provide a substantially open-circuit impedance at the external filter for the first frequency band.

In another example, the switch assembly includes a plurality of switches for adjusting the adjustable matching network according to a first switch configuration, a second switch configuration, a third switch configuration or a fourth switch configuration.

In another example, in the first switch configuration the second inductor is coupled in series between the first node and an intermediate node and the variable capacitor is connected in shunt to the intermediate node.

In another example, in the second switch configuration the second inductor is coupled in series between the intermediate node and the second node and the variable capacitor is connected in shunt to the intermediate node.

In another example, in the third switch configuration the variable capacitor is coupled in series between the first node and the intermediate node and the second inductor is connected in shunt to the intermediate node.

In another example, in the fourth switch configuration the variable capacitor is coupled in series between the intermediate node and the second node, and the second inductor is connected in shunt to the intermediate node.

In another example, the variable capacitor is a selectable capacitor bank comprising a plurality of individual capacitors.

In another example, the first node is coupled to an antenna.

In another example, the first path and second path include low noise amplifiers.

In another example, the first path and second path include matching circuits.

In another example, the first path further comprises a third filter, the third filter configured to provide a matched impedance in a third frequency band.

In another example, the first and third filters are parts of a diplexer that includes an input port coupled to the first node.

In another example, the first and second filters are implemented as surface acoustic wave filters.

According to another example there is provided a carrier aggregation circuit, comprising: a first node and a second node, a first path implemented between the first node and the second node, the first path including a first filter configured to provide a matched impedance in a first frequency band, a second path implemented between the first node and the second node, the second path including an adjustable matching network and a filter external to the carrier aggregation circuit configured to provide a matched impedance in the second frequency band, and a switch assembly configured to adjust the adjustable matching network to provide a mismatched impedance in the first frequency band.

According to another example there is provided a method for carrier aggregation comprising receiving a signal at a first node, processing a first portion of the signal through a first path including a first filter that provides a matched impedance in a first frequency band, processing a second portion of the signal through a second path including an adjustable matching network and a terminal for coupling to a filter external to the carrier aggregation circuit, and adjusting the adjustable matching network with a switch assembly to provide a mismatched impedance in the first frequency band.

In one example, the switch assembly adjusts the adjustable matching network according to a first switch configuration, a second switch configuration, a third switch configuration or a fourth switch configuration.

In another example, the capacitance of the variable capacitor is determined by selecting one or more of a plurality of individual capacitors from a selectable capacitor bank.

According to another example there is provided a radio-frequency module comprising a packaging substrate configured to receive a plurality of components, and a carrier aggregation circuit implemented on the packaging substrate, the carrier aggregation circuit including a first node and a second node, a first path implemented between the first node and the second node, the first path including a first filter configured to provide a matched impedance in a first frequency band, a second path implemented between the first node and the second node, the second path including an adjustable matching network and a terminal for coupling to a filter external to the carrier aggregation circuit, the external filter configured to provide a matched impedance in the second frequency band, and a switch assembly configured to adjust the adjustable matching network to provide a mismatched impedance in the first frequency band, and a controller configured to operate the switch assembly.

In one example, the module is a diversity receive module, a primary receive module or a transmitter module.

According to another example there is provided s wireless device comprising an antenna port coupled to an antenna, a radio-frequency module, the radio frequency module including a carrier aggregation circuit having a first node coupled to the antenna port and a second node, a first path implemented between the first node and the second node, the first path including a first filter configured to provide a matched impedance in a first frequency band, a second path implemented between the first node and the second node, the second path including an adjustable matching network and a terminal for coupling to a filter external to the carrier aggregation circuit, the external filter configured to provide a matched impedance in the second frequency band, and a switch assembly configured to adjust the adjustable matching network to provide a mismatched impedance in the first frequency band, and a controller configured to operate the switch assembly.

Still other aspects, examples, and advantages of these aspects and examples are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Aspects and examples described herein are directed to a carrier aggregation circuit having an adjustable matching network for providing a matched impedance for filters located external to the carrier aggregation circuit. This advantageously enables mobile devices to support extensive CA-band combinations while avoiding the need to duplicate components to integrate with the external filters.

It is to be appreciated that examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Cellular carrier aggregation (CA) can be supported by allowing two or more radio-frequency (RF) signals to be processed through a common path. For example, carrier aggregation can involve the use of a path for a plurality of bands having frequency ranges that are sufficiently separated. In such a configuration, simultaneous operation of more than one band is possible.

In such a carrier aggregation system, it is desirable to maintain a low noise figure (NF) for each RF signal. When two bands being aggregated are close in frequency, maintaining sufficient separation of the two bands is also desirable.

In the context of a receiver, carrier aggregation can allow concurrent processing of RF signals in a plurality of bands to provide, for example, high data-rate capability. In particular, fourth generation (4G) and fifth generation (5G) handsets support a large number of CA-band combinations in a single circuit configuration.

Figure 1:
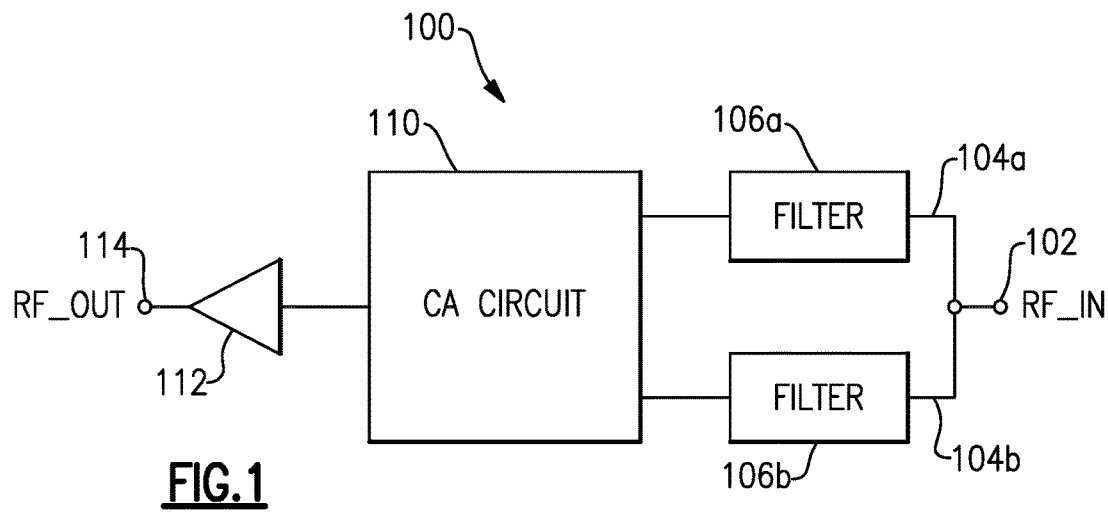
FIG. 1 shows a carrier aggregation (CA) configuration that includes a CA circuit configured to receive an input and provide an output according to an example.

FIG. 1 is a schematic diagram of a carrier aggregation (CA) configuration 100 that includes a CA circuit 110 configured to receive a plurality of inputs and yield an output. The plurality of inputs can include a first RF signal and a second RF signal. The first RF signal can be provided to the CA circuit 110 from a common input node 102 (RF_IN), through a first path 104a which includes a first filter 106a. Similarly, the second RF signal can be provided to the CA circuit 110 from the common input node 102 (RF_IN), through a second path 104b which includes a second filter 106b. As described herein, the CA circuit 110 may provide an output to a common output node 114 via a low-noise amplifier (LNA) 112, and can be configured such that the output at the common output node 114 is a recombined RF signal that includes two separated frequency bands associated with the first and second RF signals. As also described herein, the CA circuit 110 can be configured to yield desirable performance features such as low loss, low noise figure, and/or high isolation between the two signal paths 104a, 104b.

Figure 2:
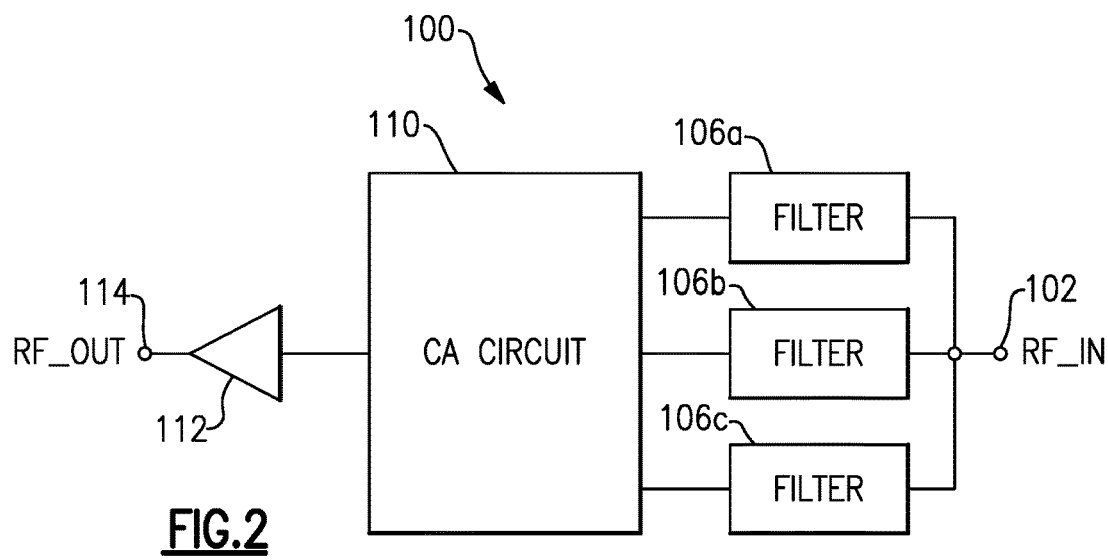
FIG. 2 shows a CA configuration that can process more than two radio-frequency signals according to an example.

Various examples herein, including the example of FIG. 1, are described in the context of aggregating two frequency bands. However, it will be understood that one or more features of the present disclosure can be implemented in aggregation of more than two frequency bands. For example, FIG. 2 is a schematic diagram of a CA configuration 100 in which three RF signals are separated at a common input node 102 (RF_IN), processed through their respective filters 106a, 106b, 106c, and recombined by a CA circuit 110 to yield a recombined RF signal at a common output node 114 (RF_OUT) via an LNA 112.

For the purpose of description, such signal paths can be referred to as "A", "B," and "C" bands, and such bands can include any combination of RF bands suitable for carrier aggregation. The frequency bands may be cellular frequency bands, such as UMTS (Universal Mobile Telecommunications System) frequency bands. For example, a first frequency band may be UMTS downlink or "Rx" Band 3, between 1805 megahertz (MHz) and 1880 MHz, a second frequency band may be UMTS downlink or "Rx" Band 66, between 2110 MHz and 2200 MHZ, and a third frequency band may be UMTS downlink or "Rx" Band 40, between 2300 MHz and 2400 MHZ.

Other downlink frequency bands may be used, such as those described below in Table 1 or other non-UMTS frequency bands.

TABLE 1

| Band | Mode | Tx Frequency Range (MHz) | Rx Frequency Range (MHz) |
|---|---|---|---|
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |

TABLE 1-continued

| Band | Mode | Tx Frequency Range (MHz) | Rx Frequency Range (MHz) |
|---|---|---|---|
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B32 | FDD | N/A | 1,452-1,496 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |
| B45 | TDD | 1,447-1,467 | 1,447-1,467 |
| B46 | TDD | 5,150-5,925 | 5,150-5,925 |
| B65 | FDD | 1,920-2,010 | 2,110-2,200 |
| B66 | FDD | 1,710-1,780 | 2,110-2,200 |
| B67 | FDD | N/A | 738-758 |
| B68 | FDD | 698-728 | 753-783 |

Frequency bands that operate in a frequency division duplex (FDD) mode perform simultaneous transmit (Tx) and receive (Rx) operations via different frequencies. For example, Band 3 operates with transmit signals having frequencies of approximately 2500 MHz to approximately 2570 MHz, and operates with receive signals having frequencies of approximately 2620 MHz to approximately 2690 MHz. This is typically accomplished by the use of a duplexer, which combines Tx and Rx paths into a common terminal. By contrast, frequency bands that operate in a time division duplex (TDD) mode have a single frequency band that is utilized for both Tx and Rx operations. For example, Band 40 operates with a single frequency band of approximately 2300 MHz to approximately 2400 MHz.

Figure 3:
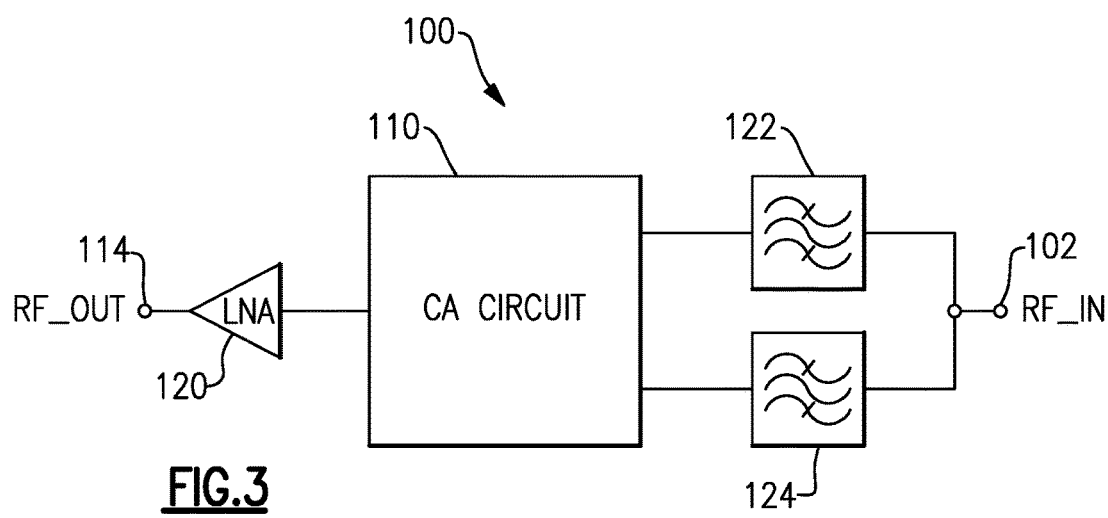
FIG. 3 shows a CA circuit implemented as a receiver with a low-noise amplifier according to an example.

The aggregation configurations 100 of FIGS. 1 and 2 can be implemented in a number of RF applications. FIG. 3 shows a more specific example where a CA circuit 110 having one or more features as described herein can be implemented with an LNA in a receiver. The CA circuit 110 can be configured to receive a plurality of inputs and yield an output. The plurality of inputs can include a first RF signal and a second RF signal. The first RF signal can be provided to the CA circuit 110 from a common input node 102 (RF_IN), through a first path that includes a first band-pass filter 122. Similarly, the second RF signal can be provided to the CA circuit 110 from the common input node 102 (RF_IN), through a second path that includes a second band-pass filter 124. As described herein, the CA circuit 110 can be configured such that the output at a common output node 114 is a recombined RF signal that includes two separated frequency bands associated with the first and second RF signals. As also described herein, the CA circuit 110 can be configured to yield desirable performance features such as low loss, low noise figure, and/or high isolation between the two input signal paths.

In FIG. 3, the recombined RF signal is shown to be provided to an LNA 120 to amplify an output signal and thereby generate a low-noise amplified output signal at an output node 114. The LNA 120 can be configured to operate with a sufficiently wide bandwidth to effectively amplify the first and second bands of the recombined RF signal.

It will be appreciated that in some examples separate LNAs may be implemented on each signal path and the RF signal is recombined after each constituent signal has been amplified. In some examples, the band-pass filters 122, 124 can be implemented in a number of ways, including, for example, as surface acoustic wave (SAW) filters. It will be understood that other types of filters can be utilized.

Typically, not all CA-band combinations are supported by a single integrated CA module, as some CA-band combinations are only required for limited-volume markets. These supplementary CA-band combinations may be supported by including one or more external CA modules that interface with the integrated CA module. However, this leads to the problem of how to adequately diplex the input RF signal between the integrated CA module and the external CA module.

Figure 4:
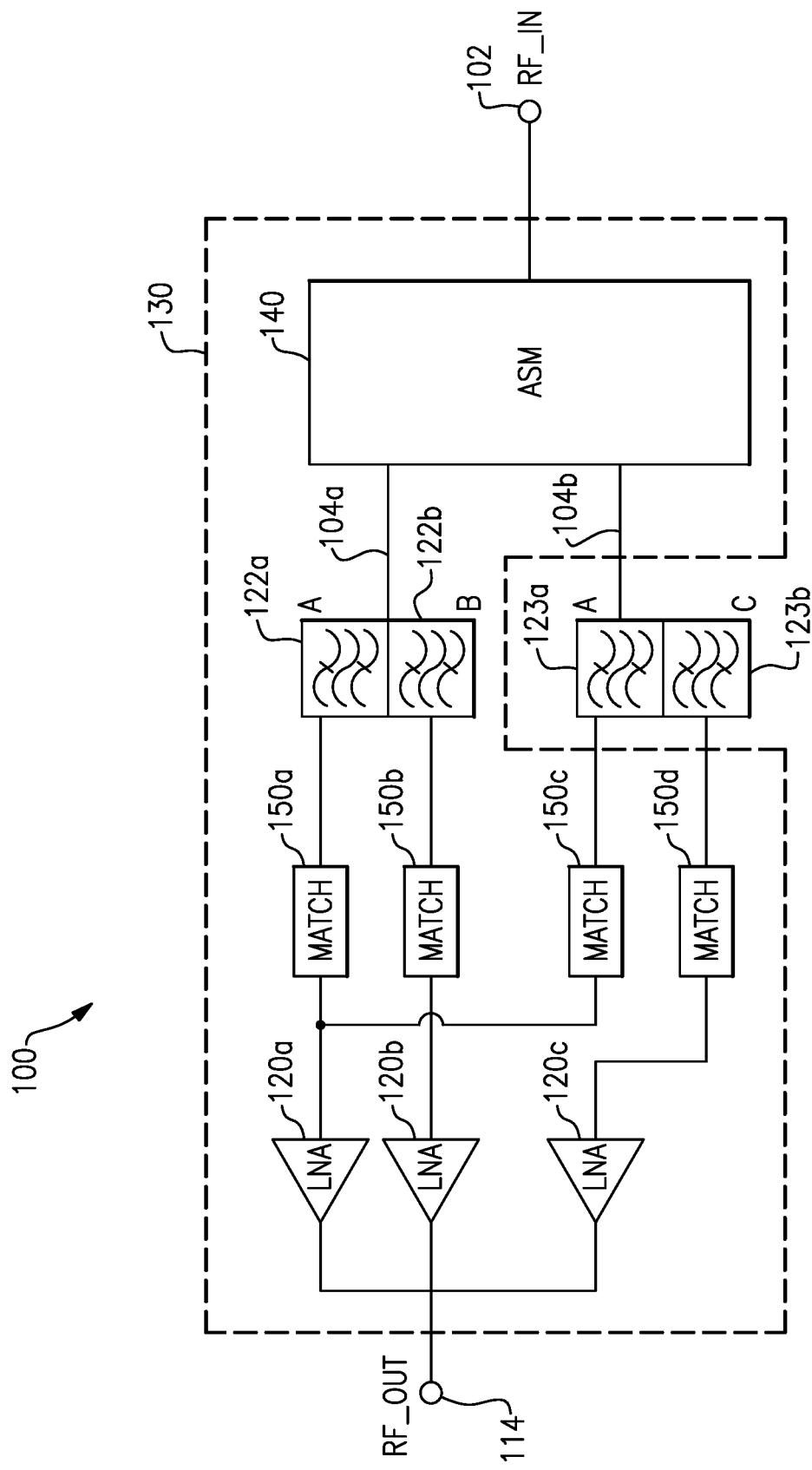
FIG. 4 shows a CA configuration that diplexes a first combination of RF signals within an integrated CA module while diplexing a second combination of RF signals external to the CA module according to an example.

One way of solving this problem is shown in the schematic diagram of FIG. 4. FIG. 4 shows a CA configuration 100 that diplexes the RF signals of a first CA-band combination within an integrated CA module 130 and diplexes the RF signals of a second CA-band combination within an external CA module (not shown).

The CA configuration 100 of FIG. 4 includes an integrated module 130 configured to receive a plurality of inputs from a common input node 102 (RF_IN) and yield an output at a common output node 114 (RF_OUT). The plurality of inputs can include a first RF signal and a second RF signal. The integrated module 130 includes an antenna switch module (ASM) configured to select one of two signal paths 104a, 104b according to the frequency bands of the first RF signal and the second RF signal.

In the example shown in FIG. 4, in normal operation the ASM selects a first signal path 104a implemented between RF_IN and RF_OUT to process a first CA-band combination comprising a Band A RF signal and a Band B RF signal. The first signal path includes a first filter 122a, a first matching circuit 150a, and a first LNA 120a, which are each configured to receive the Band A RF signal. The first signal path 104a also includes a second filter 122b, a second matching circuit 150b, and a second LNA 120b, which are configured to receive the Band B RF signal.

Alternatively, the ASM may select a second signal path 104b implemented between RF_IN and RF_OUT to process a second CA-band combination comprising a Band A RF signal and a Band C RF signal. As indicated above, the second signal path 104b includes a first external filter 123a and a second external filter 123b which are implemented external to the integrated module 130 on the printed circuit board (PCB). In some examples the first and second external filters 123a, 123b may be configured as a SAW diplexer. Similarly to the first signal path 104a, the second signal path 104b may include third and fourth matching circuits 150c, 150d and a third LNA 120c. In the example of FIG. 4, the first external filter 123a, third matching circuit 150c, and third LNA 120c are configured to receive the Band A RF signal whereas the second external filter 123b, fourth matching circuit 150d, and fourth LNA 120d are configured to receive the Band C RF signal. Typically, the matching circuits 150c, 150d and LNAs 120a, 120c of the second signal path 104b are implemented in the integral module 130, as shown in FIG. 4.

As will be appreciated, the CA configuration 100 can be configured such that the output at a common output node 114 is a recombined RF signal that includes two separated frequency bands associated with the first CA-band combination or the second CA-band combination. As also described herein, the CA circuit 110 can be configured to yield desirable performance features such as low loss, low noise figure, and/or high isolation between the two signal paths 104a, 104b.

Alternatively, the input RF signal can be diplexed external to the integrated CA module 130. In this example, the Band A and Band B RF signals can then be processed by the integrated CA module 130 as described above while the Band C RF signal is filtered externally by an external CA module.

However, neither of these solutions may be satisfactory in some applications. As will be seen from the above, because some RF bands are common to the CA-band combinations supported by both the integrated CA module 130 and the external CA module, the external CA module inevitably includes replicated filters and/or additional multiplexers which take up additional PCB space. Accordingly, it may be difficult to miniaturize CA devices when some RF bands are filtered external to an integrated CA module 130.

It may therefore be advantageous to provide a CA device that eliminates the need for replicated filters and multiplexers while providing adequate switch-plexing functionality with the external filters.

Figure 5:
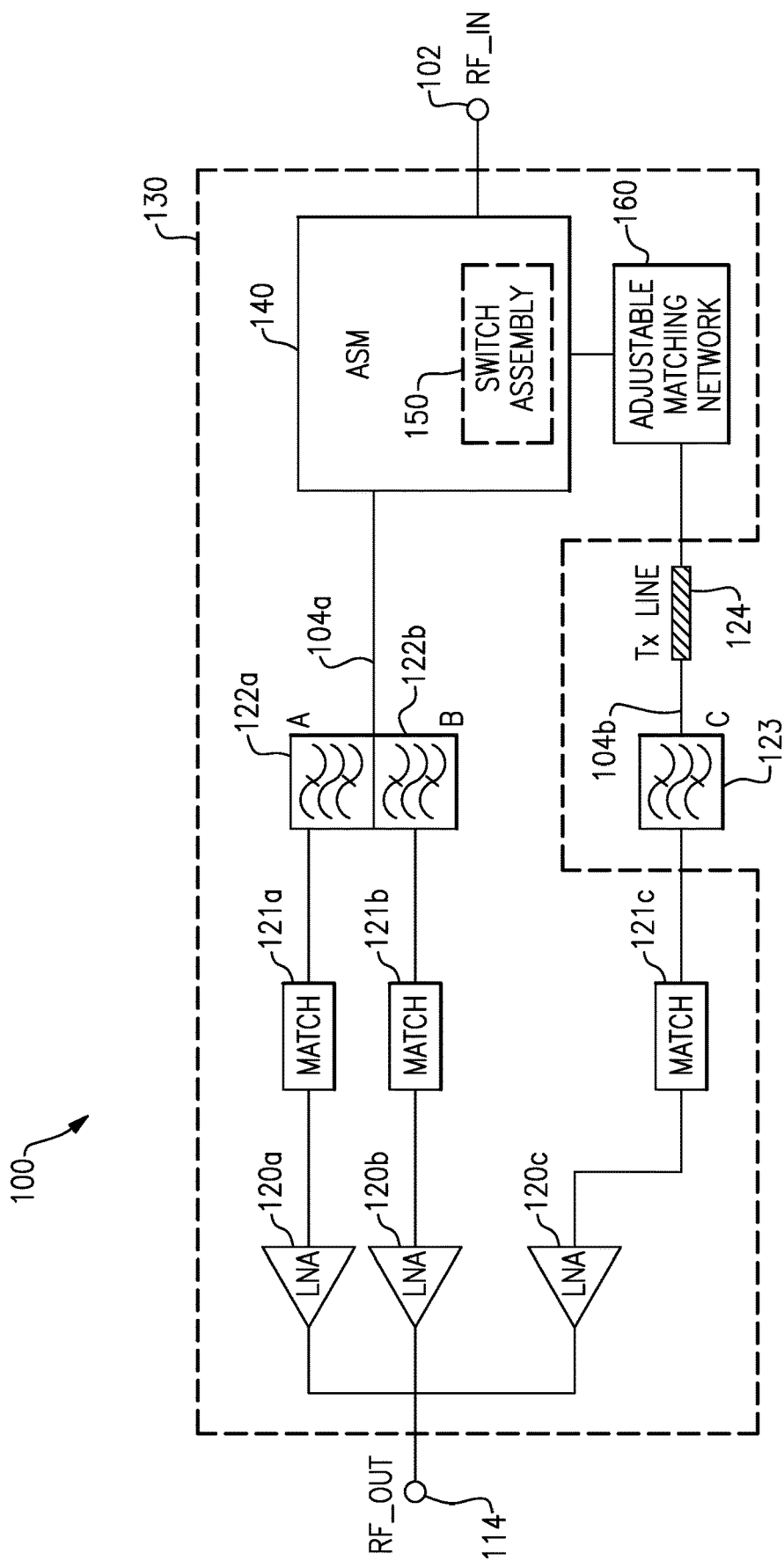
FIG. 5 shows a CA configuration that diplexes RF signals without duplicating components according to an example.

The above problems may be solved with the example CA configuration 100 shown in the schematic diagram of FIG. 5, which enables the diplexing of Band A and Band C RF signals without duplicating filters or including additional multiplexers.

The CA configuration 100 of FIG. 5 includes a first signal path 104a which is identical to the first signal path 104a shown in FIG. 4. The CA configuration 100 includes a second signal path 104b which includes a first external filter 123 implemented externally to the integrated CA module 130, a transmission line of unknown length 124, and an adjustable matching network 160. The adjustable matching network 160 is configured to be adjusted by a switch assembly 150 within the ASM 140 in order to provide a mismatched impedance for one of the RF signals as further described below. The second signal path 104b also includes a matching circuit 121c and an LNA 120c. The first external filter 123, adjustable matching network 160, matching circuit 121c and LNA 120c are configured to receive a Band C RF signal. On receiving a CA-band combination comprising a Band A RF signal and a Band C RF signal, the ASM 140 provides the Band A and Band C RF signals to both signal paths 104a, 104b.

The matching network 160 blocks Band A RF signals, and passes Band C RF signals. This is achieved by configuring the matching network 160 to provide an open-circuit impedance for Band A but a closed-circuit configuration for Band C. For a given Band C, for example Band B40, the impedance of the matching network can be tuned to provide a desired impedance for a C-band signal. Accordingly, impedance $Z_C$ for the C-band signal at the output of the matching network 160 is approximately at a matched value of $Z_0$ (for example, 50 Ohms). In the A band, the impedance $Z_A$ for the A-band signal at the output of the matching network 160 may not be matched to $Z_0$. Since the A band resides in the stopband of the C-band filter, the reflection coefficient $|\Gamma_A|$ of this mismatch is approximately unity. However, the phase of this reflection is typically dependent upon the matching network design, and the length of transmission line 124 which can vary depending on the location of the C-band filter 123 relative to the integrated CA module 130. Accordingly, the impedance $Z_A$ for the A-band signal at the output of the matching network 160 could be any widely mismatched value, either much greater or much smaller than $Z_0$, that results in the condition $|\Gamma_A| \sim 1$.

Ideally, the matching network 160 should present an open circuit for an A-band signal. However, the matching network 160 may not provide such an ideal open-circuit impedance for the A-band signal. Accordingly, impedance $Z_A$ for the A-band signal at the output of the matching network 160 can be expressed in a complex form $Z_A = R_A + jX_A$, where the real part (resistance $R_A$) and the imaginary part (reactance $X_A$) place the impedance $Z_A$ significantly away from the open-circuit state (where one or both of $X_A$ and $R_A$ is/are approximately at infinity).

A further problem may arise due to the unknown frequency band of Band C and the unknown location of the Band C filter, represented by the transmission line of unknown length 124 in FIG. 5. It may therefore be difficult to provide matching circuits for Band C within the integral CA module 130 that will successfully impedance-match the Band C signal in all circumstances. Failing to accurately impedance-match the Band C signal may lead to signal loss due to loading of the Band A signal. Tuning the adjustable matching network 160 compensates for the unknown Tx line length and choice of Band C frequency, as further described below.

Figure 6:
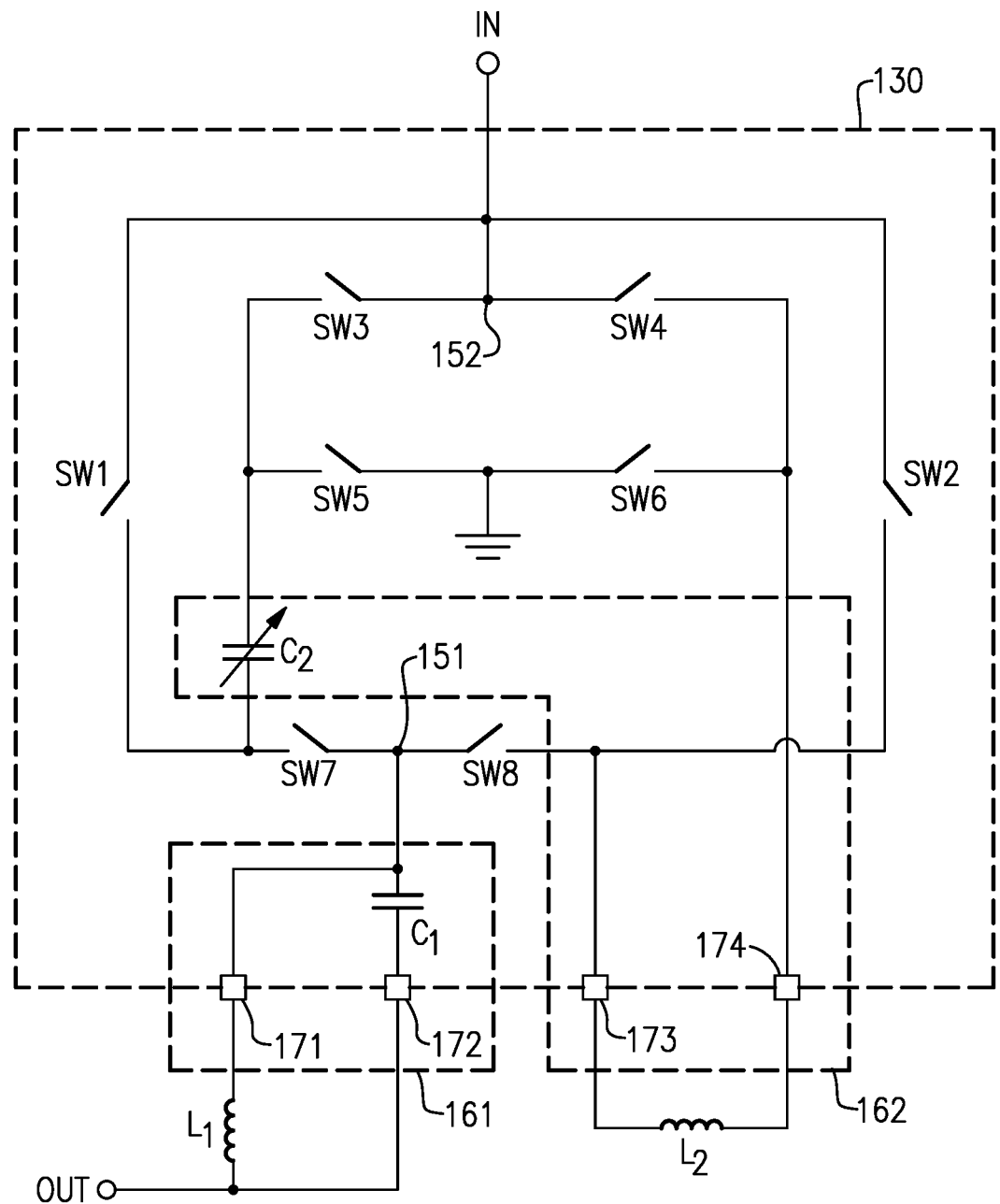
FIG. 6 shows an example switch assembly and adjustable matching network within the integrated CA module according to an example.

FIG. 6 shows a schematic diagram of a specific example of a switch assembly 150 and adjustable matching network 160 that may be implemented within integrated CA module 130. The switch assembly includes switches SW1 to SW8. The adjustable matching network 160 includes a first adjustable circuit 161, comprising a first capacitor C1, and terminals 171 and 172 for coupling to external inductor L1, and a second adjustable circuit 162, comprising a variable capacitor C2, and terminals 173 and 174 for coupling to external inductor L2. In some examples, the variable capacitor C2 may be implemented as a selectable capacitor bank comprising a plurality of individual capacitors. The second adjustable circuit 162 may include additional circuitry (not shown) to select a desired capacitance for variable capacitor C2.

External inductors L1, L2 are provided externally to the integrated CA module 130, and may be implemented in an external CA module. As shown in FIG. 6, external inductors L1, L2 may interface with the integrated CA module 130 via terminals 171, 172 and 173, 174 respectively.

The first adjustable circuit 161 is configured as a parallel L-network that presents an open circuit for Band A frequencies. The frequency at which the first adjustable circuit 161 resonates can be adjusted by adjusting the capacitance of C1 or the inductance of inductor L1, however as L1 is located externally to the integrated CA module 130 it is more convenient to adjust the first adjustable circuit 161 by selecting an appropriate inductance value for inductor L1.

The second adjustable circuit 162 is configured as a resonator circuit whereby the switch network adjusts the relative configuration of the internal capacitor C2 and the external inductor L2 such that internal capacitor C2 may be placed in series or in shunt with the first adjustable circuit 161, and external inductor L2 may be placed in series or in shunt with the first adjustable circuit 161. In some examples, this is achieved by selectively switching switches SW1-SW8 into an open or closed position according to a plurality of switch configurations.

In a first switch configuration, the adjustable circuit 162 is configured as an L-network with external inductor L2 as the series element and internal capacitor C2 in shunt by closing switches SW4, SW8, SW7, and SW5 and opening switches SW1, SW2, SW3 and SW6. As shown in FIG. 6, in the first switch configuration external inductor L2 is coupled in series between the RF input node and an intermediate node 151 and the variable capacitor C2 is connected in shunt to the intermediate node 151.

In a second switch configuration, the adjustable circuit 162 is configured as a different L-network with external inductor L2 as the series element and internal capacitor C2 in shunt by closing switches SW4, SW8, SW1, and SW5 and opening switches SW2, SW3, SW6 and SW7. In the second switch configuration external inductor L2 is coupled in series between an intermediate node 152 and the RF output node and the variable capacitor C2 is connected in shunt to the intermediate node 152.

In a third switch configuration, the adjustable circuit 162 is configured as an L-network with internal capacitor C2 as the series element and external inductor L2 in shunt by closing switches SW3, SW7, SW8, and SW6 and opening switches SW1, SW2, SW4 and SW5. In the third switch configuration variable capacitor C2 is coupled in series between the RF input node and the intermediate node 151 and the external inductor L2 is connected in shunt to the intermediate node 151.

In a fourth switch configuration, the adjustable circuit 162 is configured as a different L-network with internal capacitor C2 as the series element and external inductor L2 in shunt by closing switches SW3, SW7, SW2, and SW6 and opening switches SW1, SW4, SW5 and SW8. In the fourth switch configuration variable capacitor C2 is coupled in series between an intermediate node 152 and the RF output node and the external inductor L2 is connected in shunt to the intermediate node 152.

Configuring adjustable circuit 162 to include reactive loads in series with adjustable circuit 161 modifies the impedance of the adjustable circuit 162 by either adding a positive reactance for an inductor in series, or a negative reactance for a capacitor in series. Including reactive loads in shunt will modify the admittance (that is, the reciprocal of the impedance) by either adding a positive susceptance for an inductor in shunt, or a negative susceptance for a capacitor in shunt. Accordingly, by adjusting the configuration of the L-network and adjusting the capacitance of C2, the second adjustable circuit 162 is able to provide a matched impedance for a Band C signal and a mismatched impedance for a Band A signal such that the external Band C filter 123c does not load the Band A signal regardless of the Band C frequency or the relative location of the Band C filter on the PCB.

Table 2 below shows example insertion loss values for internal filter 122a (Band B3) and external filter 123 (Band B40) at 2 GHz for a variety of different phases presented by the external transmission line. In ideal circumstances, the insertion loss for each filter is approximately 2 dB.

TABLE 2

| Phase: External Tx line | Insertion loss: B3 | Insertion loss: B40 |
|---|---|---|
| 0 | 1.8 | 2.2 |
| 30 | 1.8 | 1.6 |
| 60 | 1.9 | 1.7 |
| 90 | 1.8 | 1.8 |
| 120 | 1.8 | 2.4 |
| 150 | 1.9 | 2.3 |
| 180 | 1.7 | 2.2 |
| 210 | 1.8 | 1.5 |
| 240 | 1.8 | 1.7 |
| 270 | 1.9 | 2.3 |
| 300 | 2 | 2.4 |
| 330 | 1.7 | 1.7 |
| 360 | 1.8 | 1.6 |

As may be seen, insertion loss of approximately 2 dB is substantially achieved for Band B3, however the values in Table 2 indicate that the insertion loss in Band B40 could be improved further. As described above, the insertion loss in Band B40 could be improved by tuning adjustable circuit 162.

Figure 7:
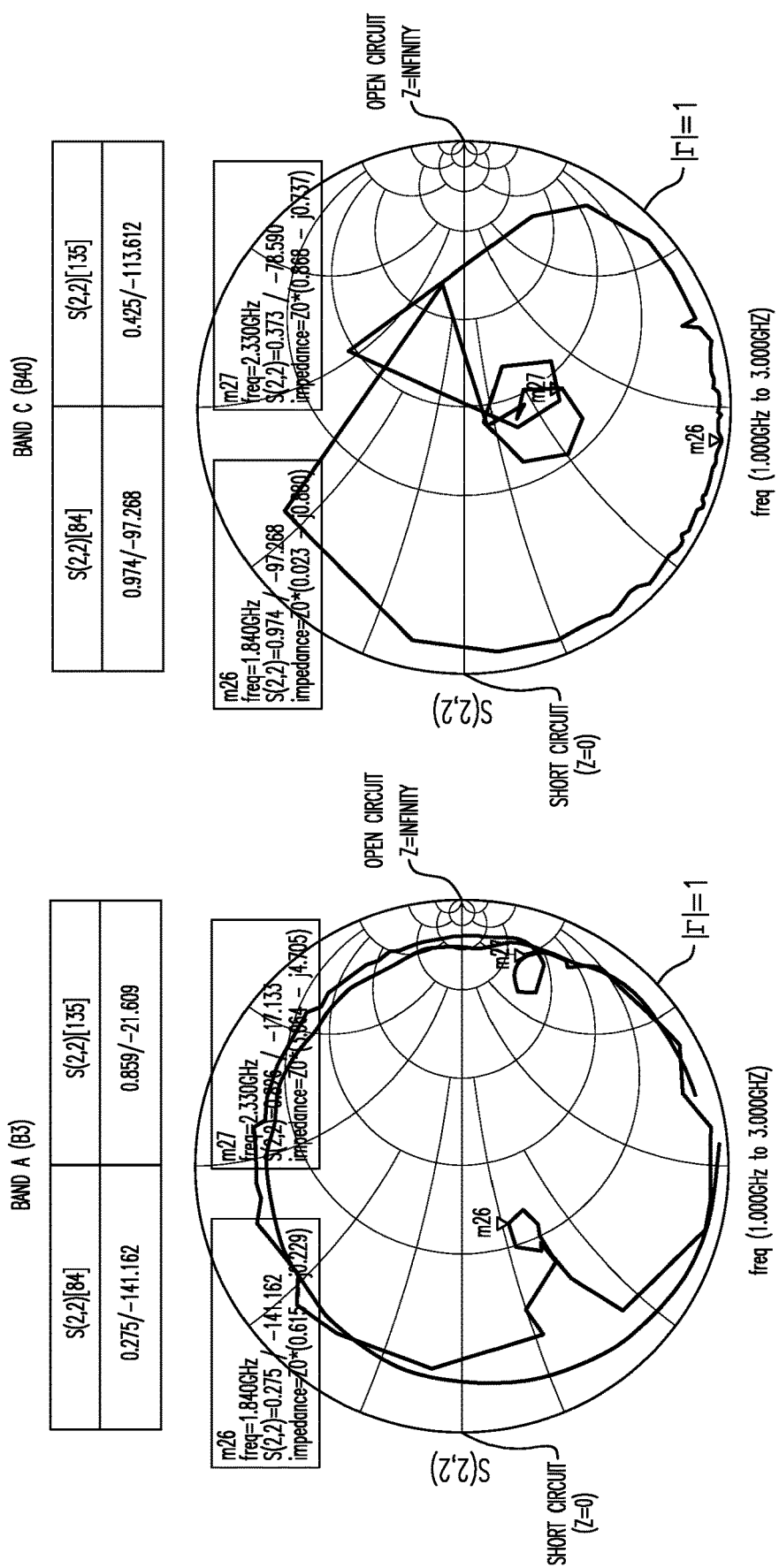
FIG. 7 shows example Smith plots of complex impedance values for the circuit of FIG. 5 according to an example.

FIG. 7 shows example Smith plots of complex impedance values for the output reflection coefficients at the internal Band A filter (left plot) and the external Band C filter (right plot) in a frequency sweep between 1.000 GHz and 3.000 GHz for the circuit of FIG. 5. In both plots, the impedance value for point m26 corresponds to the center frequency (1.840 GHz) of the B3 Rx band, that is, the Band A signal, and the impedance value for point m27 corresponds to the center frequency (2.350 GHz) of the B40 Rx band, that is, the Band C signal.

It can be seen from FIG. 7 that for the Band A filter (left plot) point m26 (the in-band frequency) lies relatively close to the center-point of the Smith chart, where the signal is impedance matched. Point m27 lies close to the open-circuit impedance location on the Smith plot, while remaining relatively close to the outer perimeter of the Smith chart, where $|\Gamma|=1$. This means that the Band A filter is substantially blocking Band C signals while preventing loading of the Band C signal.

For the Band C filter (right plot), point m27 (the in-band frequency) lies relatively close to the center-point of the Smith chart where the signal is impedance matched. Point m26 is located close to the outer perimeter of the Smith chart, where $|\Gamma|=1$, but is significantly displaced from the open-circuit impedance location on the Smith chart. This illustrates the above case, where any widely mismatched impedance value is able to result in the condition $|\Gamma|\sim 1$, and means that the Band C filter is not effectively blocking the Band A RF signal. The out-of-band frequency (Band A) could be blocked more effectively by tuning the phase of the adjustable circuit 162.

Figure 8:
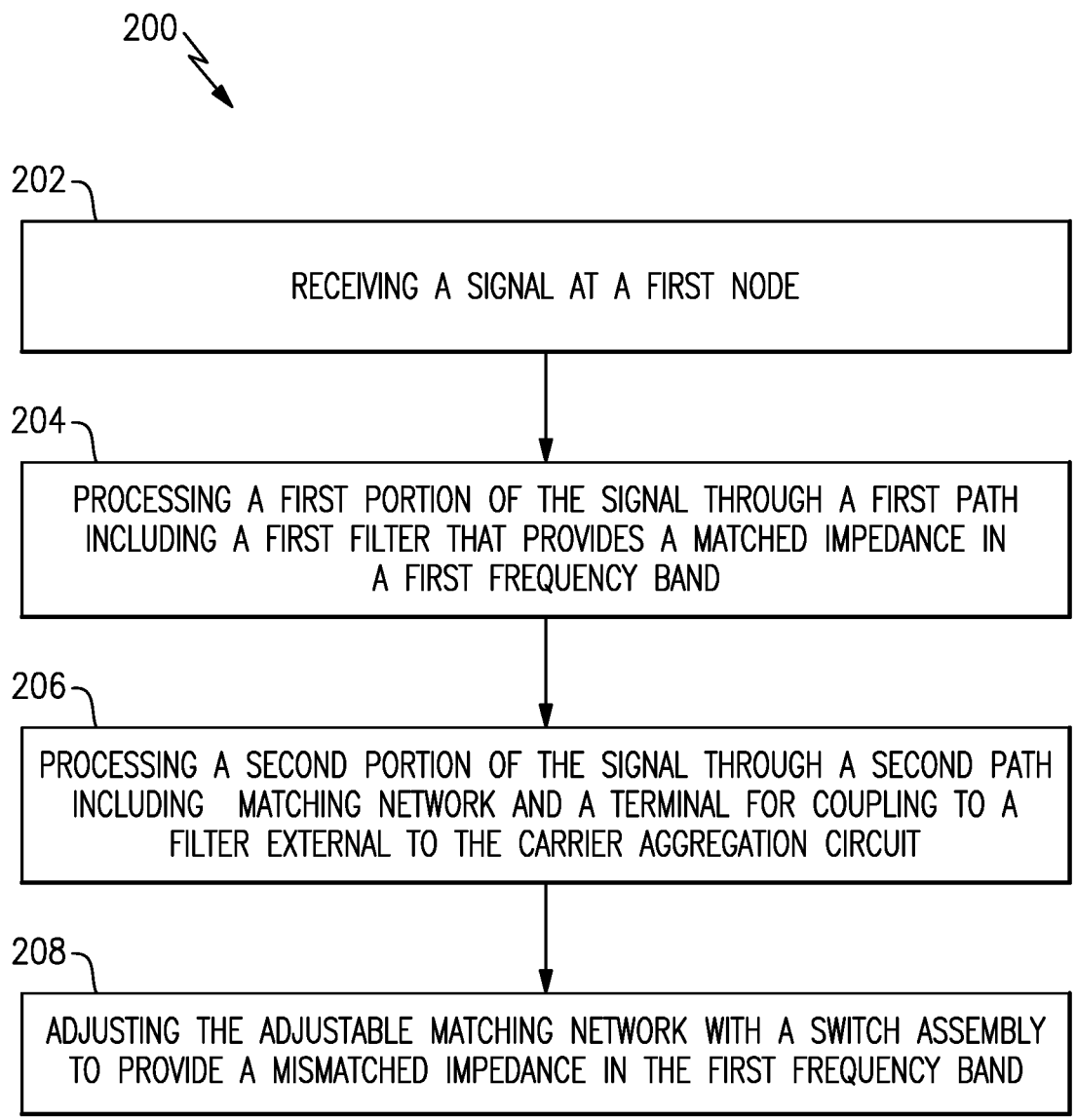
FIG. 8 shows an example method for carrying out carrier aggregation techniques according to an example.

FIG. 8 shows an example method 200 that can be implemented to carry out carrier aggregation as described herein. In a first step 202, a signal is received at a first node, such as an RF input node. In a second step 204, a first portion of the signal is processed through a first signal path that includes a first filter providing a matched impedance in a first frequency band. In a third step 206, a second portion of the signal is processed through a second path that includes an adjustable matching network and a terminal for coupling to an external filter. In a final step 208, the adjustable matching network is adjusted with a switch assembly to provide a mismatched impedance in the first frequency band.

Figure 9:
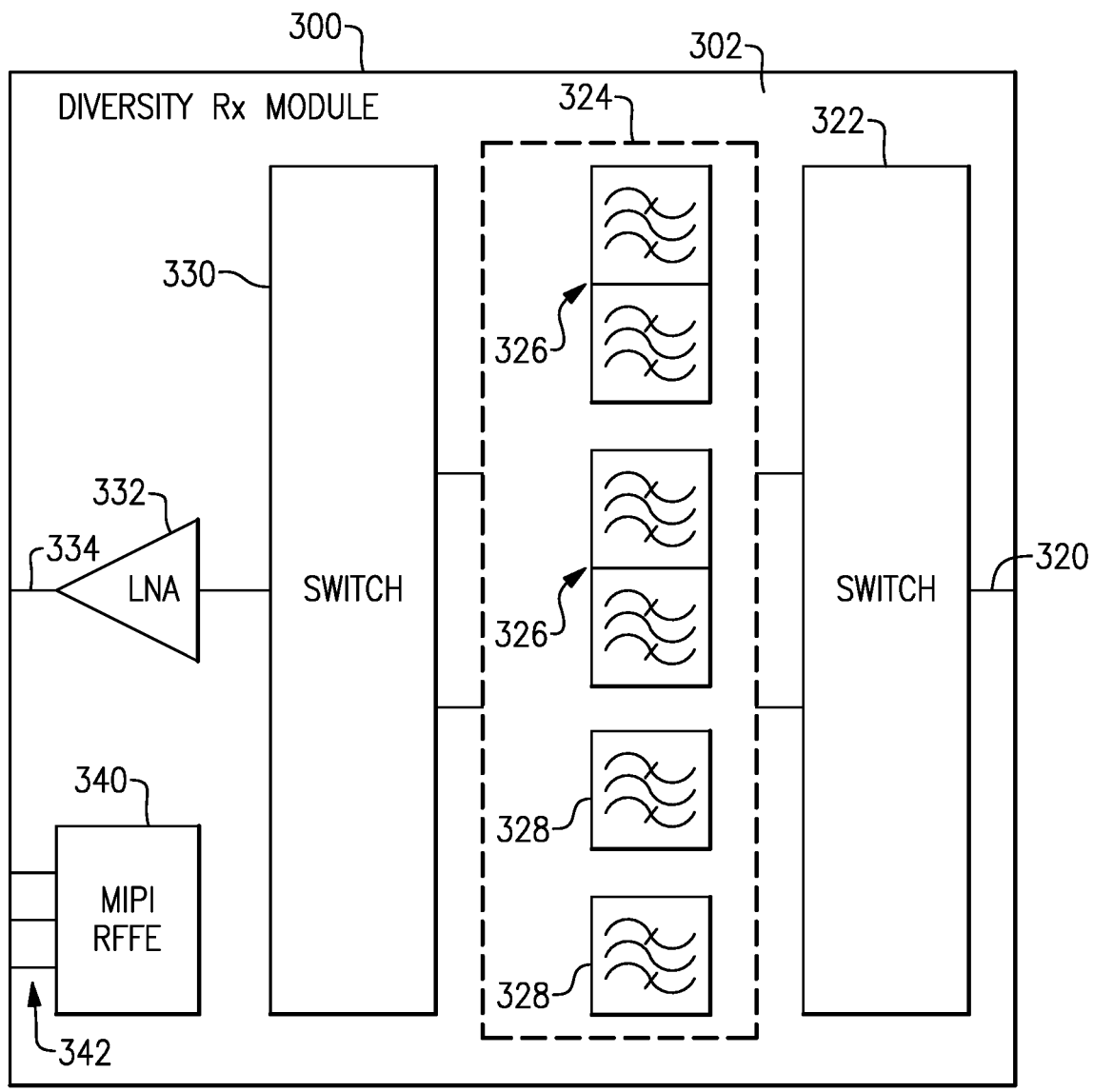
FIG. 9 shows that one or more features of the present disclosure can be implemented in a diversity receive module according to an example.

FIG. 9 shows that in some examples, one or more features of the present disclosure can be implemented in a diversity receive (DRx) module 300. However, it will be appreciated that the implementation of the CA configurations described above may be implemented in other modules, such as a primary receive module or a transmit module. Such modules can include a packaging substrate 302 (for example, a laminate substrate) configured to receive a plurality of components, as well to provide or facilitate electrical connections associated with such components.

In the example of FIG. 9, the DRx module 300 can be configured to receive an RF signal from a diversity antenna (not shown in FIG. 9) at an input 320 and route such an RF signal to an LNA 332. It will be understood that such routing of the RF signal can involve CA and/or non-CA configurations. It will also be understood that although one LNA (for example, a broadband LNA) is shown, there may be more than one LNA in the DRx module 300. Depending on the type of LNA and the mode of operation (for example, CA or non-CA), an output 334 of the LNA 332 can include one or more frequency components associated with one or more frequency bands.

In some examples, some or all of the foregoing routing of the RF signal between the input 320 and the LNA 332 can be facilitated by an assembly of one or more switches 322 between the input 320 and an assembly of diplexer(s) and/or filter(s) (collectively indicated as 324), and an assembly of one or more switches 330 between the diplexer/filter assembly 324 and the LNA 332. The switch assembly 322 includes adjustment circuits coupled to an external filter (not shown). In some examples, the switch assemblies 322, 330 can be implemented on, for example, one or more silicon-on-insulator (SOI) die. In some examples, some or all of the foregoing routing of the RF signal between the input 320 and the LNA 332 can be achieved without some or all of the switches associated with the switch assemblies 322, 330.

In the example of FIG. 9, the diplexer/filter assembly 324 is depicted as including two example diplexers 326 and two individual filters 328. It will be understood that the DRx module 300 can have additional or fewer diplexers, and additional or fewer individual filters. Such diplexer(s)/filter(s) can be implemented as, for example, surface-mount devices (SMDs), as part of an integrated circuit (IC), or some combination thereof. Such diplexers/filters can include or be based on, for example, SAW filters, and can be configured as high-Q devices.

In some examples, the DRx module 300 can include a control component such as a MIPI RFFE interface 340 configured to provide and/or facilitate control functionalities associated with some or all of the switch assemblies 322, 330 and the LNA 332. Such a control interface can be configured to operate with one or more I/O signals 342.

Figure 10:
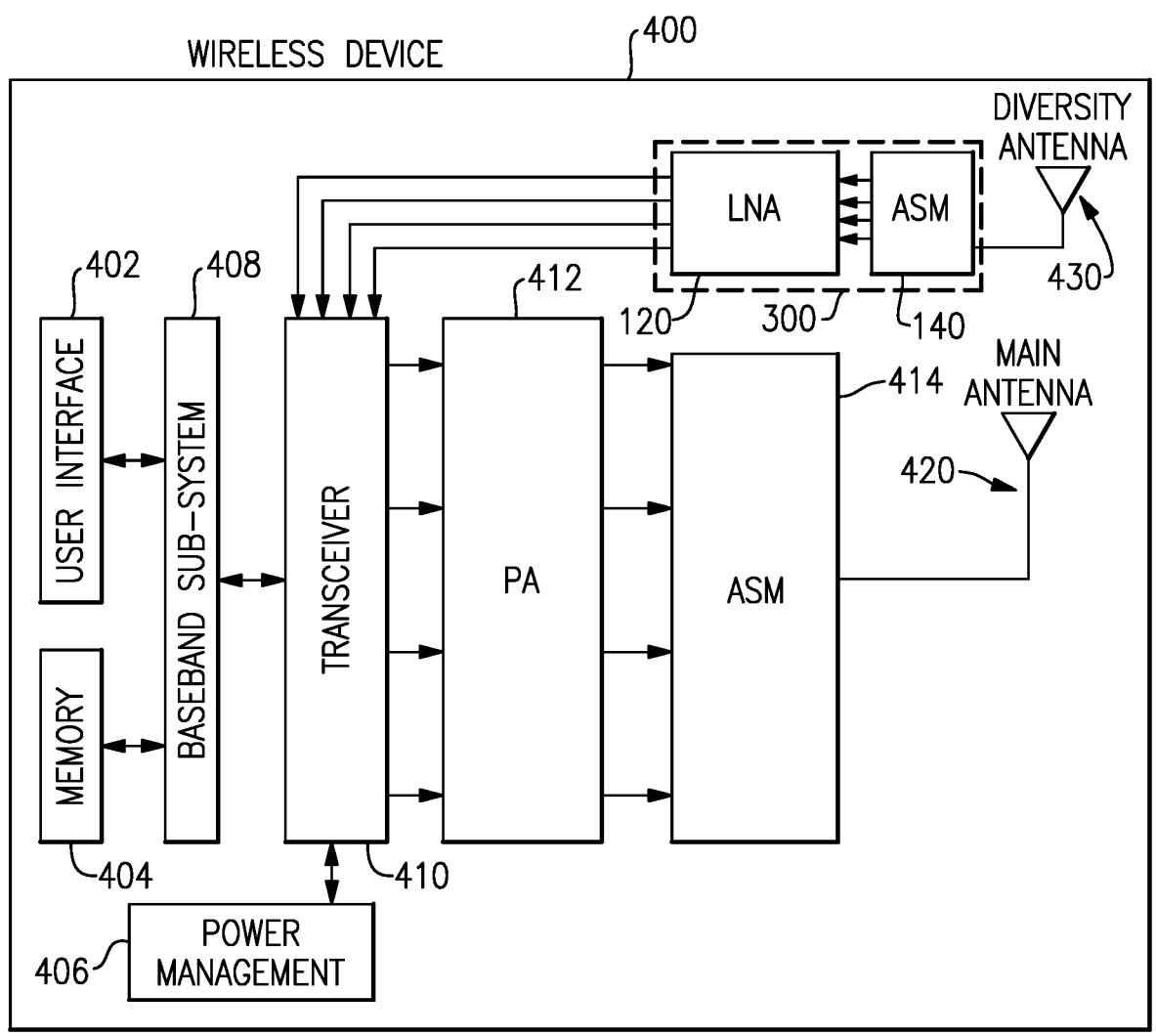
FIG. 10 shows an example wireless device having the diversity receive module of FIG. 9 according to an example.

FIG. 10 schematically depicts an example wireless device 400 having one or more advantageous features described herein. In some examples, such advantageous features can be implemented in a front-end module (FEM) 300 as described herein. One or more of such features can also be implemented in a main ASM 140. In some examples, such an FEM/architecture can include additional or fewer components than as indicated by the dashed box.

PAs in a PA module 412 can receive respective RF signals from a transceiver 410 that can be configured and operated to generate RF signals to be amplified and transmitted, and to process received signals. The transceiver 410 is shown to interact with a baseband sub-system 408 which is configured to provide conversion between data and/or voice signals suitable for a user and RF signals suitable for the transceiver 410. The transceiver 410 is also shown to be connected to a power-management component 406 that is configured to manage power for the operation of the wireless device 400. Such power management can also control operations of the baseband sub-system 408 and other components of the wireless device 400.

The baseband sub-system 408 is shown to be connected to a user interface 402 to facilitate various input and output of voice and/or data provided to and received from the user. The baseband sub-system 408 can also be connected to a memory 404 which is configured to store data and/or instructions to facilitate the operation of the wireless device, and/or to provide storage of information for the user.

In the example wireless device 400, the front-end module 300 can include one or more carrier aggregation-capable signal paths configured to provide one or more functionalities as described herein. Such signal paths can be in communication with an ASM 140 through respective diplexer(s). In some examples, at least some of the signals received through a diversity antenna 430 can be routed from the ASM 140 to one or more LNAs 120 in manners as described herein. Amplified signals from the LNAs 120 are shown to be routed to the transceiver 410.

A number of other wireless-device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 11:
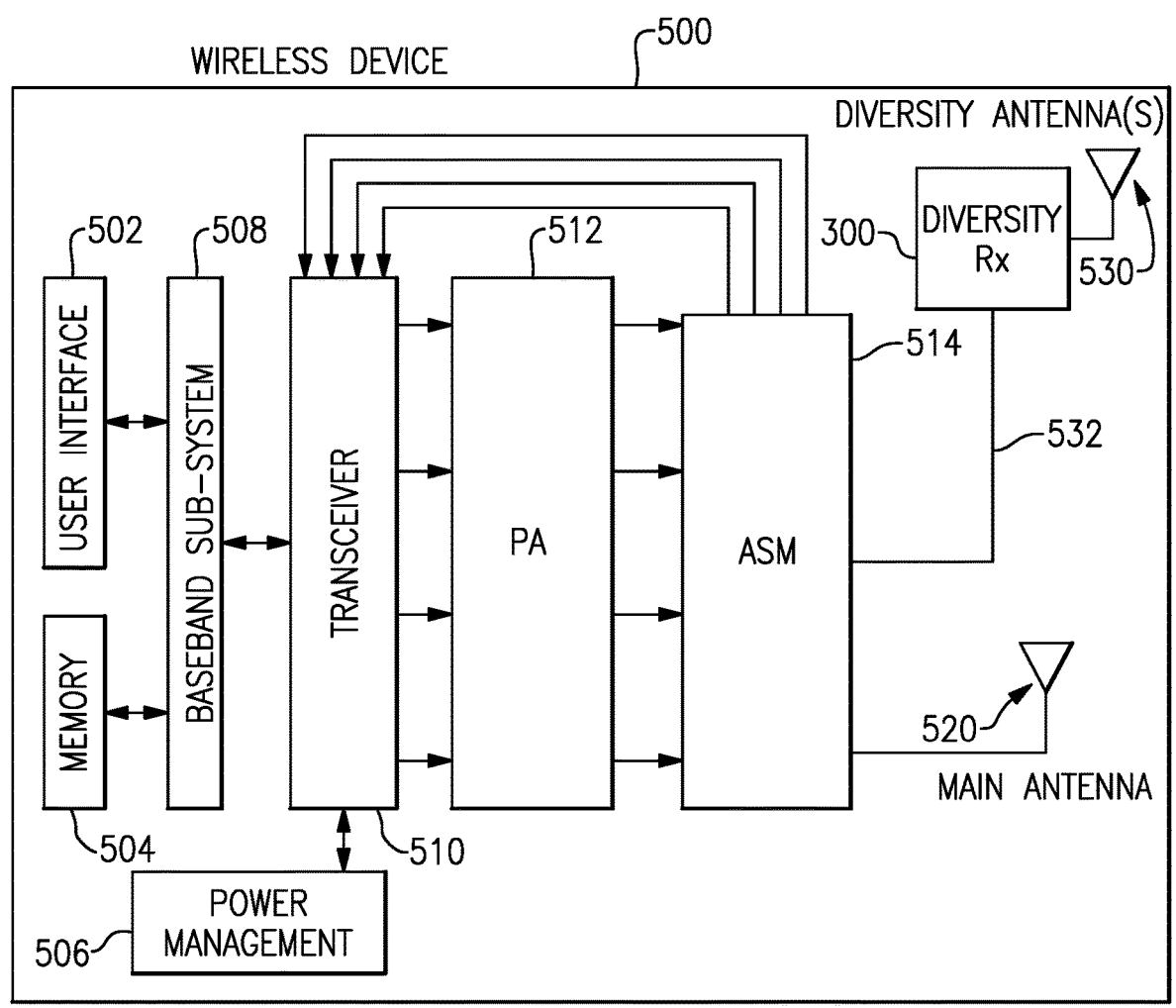
FIG. 11 shows a further example wireless device having the diversity receive module of FIG. 9 according to an example.

FIG. 11 shows that in some examples, a DRx module 300 having one or more features as described herein (for example, DRx module 300 of FIG. 9) can be included in an RF device such as a wireless device 500. In such a wireless device, components such as user interface 502, memory 504, power management 506, baseband sub-system 508, transceiver 510, power amplifier (PA) 512, ASM 514, and antenna 520 can be generally similar to the examples of FIG. 10. In some examples, the DRx module 300 can be implemented between one or more diversity antennas and the ASM 514. Such a configuration can allow an RF signal received through the diversity antenna 530 to be processed (in some examples, including amplification by an LNA) with little or no loss of, and/or little or no addition of, noise to the RF signal from the diversity antenna 530. Such processed signal from the DRx module 300 can then be routed to the ASM 514 through one or more signal paths 532 which can be relatively lossy.

Examples of the disclosure described above are also able to diplex Tx signals, for example when operating in an E-UTRAN New Radio-Dual Connectivity mode (EN-DC). In EN-DC, 5G handsets are configured to communicate simultaneously with LTE and 5G NR networks. In such situations, the Band A RF signal is typically a Band B3 LTE anchor signal and the Band C RF signal is typically a Band B41 5G NR data signal. However, if the B41 filter is located external to an integrated CA module then the Band A, B, and C transmit signals may be diplexed to prevent the Band A Rx anchor signals from being interrupted when transmitting Band C Tx signals.

This problem may be difficult to overcome with existing solutions. Diplexing the signals internally requires including a separate Tx module within the CA module, which dramatically increases the size and cost of these components. Alternatively, a Tx filter for Band C (that is, an N41 Tx filter) can be placed external to the CA module, however it then becomes very difficult to diplex the external Band C signal with the internal Band A signal. These problems are solved by examples of the disclosure by ensuring that the Band C RF signal can always be impedance-matched and diplexed with the Band A RF signal, regardless of whether the signal is Tx or Rx.

Having described above several aspects of at least one example, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A carrier aggregation circuit, comprising:
a first node and a second node;
a first path implemented between the first node and the second node, the first path including a first filter configured to provide a matched impedance in a first frequency band;
a second path implemented between the first node and the second node, the second path including an adjustable matching network and a terminal for coupling to a filter external to the carrier aggregation circuit, the external filter configured to provide a matched impedance in a second frequency band; and
a switch assembly configured to adjust the adjustable matching network to provide a mismatched impedance in the first frequency band.

2. The carrier aggregation circuit of claim 1 wherein the switch assembly is further configured to adjust the adjustable matching network to provide a matched impedance in the second frequency band, the adjustable matching network including a variable capacitor and an inductor.

3. The carrier aggregation circuit of claim 2 wherein the switch assembly includes a plurality of switches for adjusting the adjustable matching network according to a first switch configuration, a second switch configuration, a third switch configuration, or a fourth switch configuration.

4. The carrier aggregation circuit of claim 3 wherein in the first switch configuration the inductor is coupled in series between the first node and an intermediate node and the variable capacitor is connected in shunt to the intermediate node.

5. The carrier aggregation circuit of claim 3 wherein in the second switch configuration the inductor is coupled in series between an intermediate node and the second node and the variable capacitor is connected in shunt to the intermediate node.

6. The carrier aggregation circuit of claim 3 wherein in the third switch configuration the variable capacitor is coupled in series between the first node and an intermediate node and the inductor is connected in shunt to the intermediate node.

7. The carrier aggregation circuit of claim 3 wherein in the fourth switch configuration the variable capacitor is coupled in series between an intermediate node and the second node, and the inductor is connected in shunt to the intermediate node.

8. The carrier aggregation circuit of claim 1 wherein the adjustable matching network comprises a first adjustable circuit including a first capacitor and a second terminal for coupling with a first inductor.

9. The carrier aggregation circuit of claim 1 wherein the adjustable matching network includes a second adjustable circuit including a variable capacitor and a third terminal for coupling with a second inductor.

10. The carrier aggregation circuit of claim 9 wherein the switch assembly is configured to adjust the second adjustable circuit to provide a substantially open-circuit impedance at the external filter for the first frequency band.

11. The carrier aggregation circuit of claim 9 wherein the switch assembly is configured to adjust the second adjustable circuit by selecting a capacitance of the variable capacitor to provide a substantially open-circuit impedance at the external filter for the first frequency band.

12. The carrier aggregation circuit of claim 2 wherein the variable capacitor is a selectable capacitor bank comprising a plurality of individual capacitors.

13. The carrier aggregation circuit of claim 1 wherein the first node is coupled to an antenna.

14. The carrier aggregation circuit of claim 1 wherein the first path and second path include low-noise amplifiers.

15. The carrier aggregation circuit of claim 1 wherein the first path and second path include matching circuits.

16. The carrier aggregation circuit of claim 1 wherein the first path further comprises a third filter, the third filter configured to provide a matched impedance in a third frequency band.

17. The carrier aggregation circuit of claim 16 wherein the first and third filters are parts of a diplexer which includes an input port coupled to the first node.

18. The carrier aggregation circuit of claim 1 wherein the first and second filters are implemented as surface acoustic wave filters.

19. A carrier aggregation circuit, comprising:
a first node and a second node;
a first path implemented between the first node and the second node, the first path including a first filter configured to provide a matched impedance in a first frequency band;
a second path implemented between the first node and the second node, the second path including an adjustable matching network and a filter external to the carrier aggregation circuit configured to provide a matched impedance in the second frequency band; and
a switch assembly configured to adjust the adjustable matching network to provide a mismatched impedance in the first frequency band.

20. A method for carrier aggregation comprising:
receiving a signal at a first node of a carrier aggregation circuit;
processing a first portion of the signal through a first path including a first filter that provides a matched impedance in a first frequency band;
processing a second portion of the signal through a second path including an adjustable matching network and a terminal for coupling to a filter external to the carrier aggregation circuit; and
adjusting the adjustable matching network with a switch assembly to provide a mismatched impedance in the first frequency band.

21. The method of claim 20 wherein the switch assembly adjusts the adjustable matching network according to a first switch configuration, a second switch configuration, a third switch configuration, or a fourth switch configuration.

22. The method of claim 20 wherein adjusting the adjustable matching network includes adjusting a capacitance of a variable capacitor, and the capacitance of the variable capacitor is determined by selecting one or more of a plurality of individual capacitors from a selectable capacitor bank.

23. A radio-frequency module comprising:
a packaging substrate configured to receive a plurality of components;
a carrier aggregation circuit implemented on the packaging substrate, the carrier aggregation circuit including a first node and a second node, a first path implemented between the first node and the second node, the first path including a first filter configured to provide a matched impedance in a first frequency band, a second path implemented between the first node and the second node, the second path including an adjustable matching network and a terminal for coupling to a filter external to the carrier aggregation circuit, the external filter configured to provide a matched impedance in the second frequency band, and a switch assembly configured to adjust the adjustable matching network to provide a mismatched impedance in the first frequency band; and
a controller configured to operate the switch assembly.

24. The radio-frequency module of claim 23 wherein the module is a diversity receive module, a primary receive module, or a transmitter module.

25. A wireless device comprising:
an antenna port coupled to an antenna;
a radio-frequency module, the radio-frequency module including a carrier aggregation circuit having a first node coupled to the antenna port and a second node, a first path implemented between the first node and the second node, the first path including a first filter configured to provide a matched impedance in a first frequency band, a second path implemented between the first node and the second node, the second path including an adjustable matching network and a terminal for coupling to a filter external to the carrier aggregation circuit, the external filter configured to provide a matched impedance in the second frequency band, and a switch assembly configured to adjust the adjustable matching network to provide a mismatched impedance in the first frequency band; and
a controller configured to operate the switch assembly.

* * * * *